United States Patent [19]

Cirri

[11] Patent Number: 5,175,468
[45] Date of Patent: Dec. 29, 1992

[54] DEVICE FOR GENERATING AN ON-OFF MODULATION ELECTRON BEAM

[75] Inventor: Gianfranco Cirri, Firenze, Italy

[73] Assignee: Proel Technologie S.p.A., Firenze, Italy

[21] Appl. No.: 798,526

[22] Filed: Nov. 26, 1991

[30] Foreign Application Priority Data

Nov. 30, 1990 [IT] Italy .................. 9535 A/90

[51] Int. Cl.⁵ .................. H01J 29/46; G09G 1/04
[52] U.S. Cl. .................. 315/14; 315/384
[58] Field of Search .................. 315/14, 382, 383, 384

[56] References Cited

U.S. PATENT DOCUMENTS

| | | | |
|---|---|---|---|
| 3,300,735 | 1/1967 | Badger | 315/14 |
| 3,409,798 | 11/1968 | McCann | 315/14 |

OTHER PUBLICATIONS

Banks et al., "VCAP Experiments on STS-3," pp. 1-29.

*Primary Examiner*—Gregory C. Issing
*Attorney, Agent, or Firm*—McGlew and Tuttle

[57] ABSTRACT

An electron gun and a high tension switch permits the achievement of high-power electron beams which are ON-OFF modulated by DC up to frequencies exceeding kHz. The electron gun has a cathode, at least two accelerating electrodes, a cathode heater, and a possible focussing system. The or each accelerating voltage, generated by any source, which may in the case of space applications also be a tether, is applied between accelerating electrodes and cathode, with the exception of an appropriate accelerating electrode to which there is applied, by of the switch, alternately its accelerating voltage or the same voltage as that of the cathode, obtaining an ON-OFF modulation of the electron beam emitted by the gun.

7 Claims, 1 Drawing Sheet

DEVICE FOR GENERATING AN ON-OFF MODULATION ELECTRON BEAM

FIELD OF THE INVENTION

The present invention relates in general to a control system for an electron gun and in particular to a device for turning the electron beam of the electron gun, on and off.

BACKGROUND OF THE INVENTION

The ON-OFF modulation of the power electron beam (in the order of 1 kW or tens of kW) emitted by an electron gun has hitherto been obtained in various ways. One of these is the use of a control electrode (grid) to which there is alternately applied a negative potential in the order of tens/hundreds of volts with respect to that of the cathode. The potential is applied in a manner as to obtain beam prohibition (OFF), and at a potential close to that of the cathode or even positive, to permit beam emission (ON). Such a solution involves the generation of a dedicated voltage, modulated between two levels, and its application to an appropriate electrode (grid) (FIG. 1).

Another problem with regard to grids is their resistance to mechanical and thermal stresses and thus their reliability, which is important especially in the space and occupational field.

Further solutions, which do not take into account the use of a dedicated electrode (grid), modulate the accelerating voltage applied to the electron gun at the desired frequency or act on the cathode emission, the latter however being band-limited to a few Hz by the thermal time constant of the cathode.

Systems already used in the space field are:
  the interposition of a solid state interrupter in series with the cathode bias (FIG. 2), which has permitted the achievement of the ON-OFF modulation of a beam using 1 keV, 100 mA [P. Banks et at., VCAP EXPERIMENTS ON STS-3], i.e. a beam of limited power; this is because such a solution implies the interruption, at high tension, of the cathode emission current;
  the use of high-tension power generator, itself having a modulated output, as generator of the accelerating voltage. In this case, it is necessary to provide: ON-OFF modulation of the full output power; optimization of the design of the generator having regard to the load (characteristics of the gun).

SUMMARY AND OBJECTS OF THE PRESENT INVENTION

In substance, according to the invention, the device has an electron gun, its services and sources of accelerating voltage or voltages for accelerating electrodes. The electron gun has a high tension switch, with which there is associated an appropriate accelerating electrode, for the generation of an ON-OFF modulated electron beam.

The object of the present invention is to obtain an ON-OFF modulated power electron beam, using an appropriate accelerating electrode of the electron gun, its own accelerating voltage and a high tension switch. The object of the present invention further comprises the possibility of regulating the beam current emitted in the ON condition by means of a closed-loop control, which regulates the heating power and thus the temperature of the cathode in such a manner as to bring into coincidence the emitted beam current intensity and the required intensity by means of a digital command.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention ar illustrated.

DETAILED DESCRIPTION OF THE PREFERRED EMBODIMENT

Figure 3:
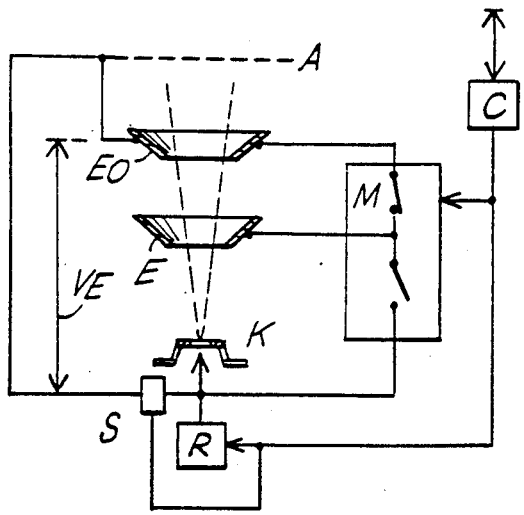
FIGS. 3 and 4 show a solution according to the invention, in the ON condition and in the OFF condition respectively.

The switch M diagrammatically represented in FIG. 3 (with a double interrupter) operates as modulator. The accelerating voltage $V_E$ is applied to the accelerating electrode E only during the time intervals in which beam emission is desired (ON). In order to prohibit the beam (OFF, FIG. 4), there is applied to the electrode E the same voltage as is present on the cathode K. In the OFF condition there may be a beam current, which is indeed a function of the design of the electron gun, this being negligible as compared with that in the ON condition. This is due to the presence of the other accelerating electrodes E1 which are continuously biased. The closed-loop regulation of the emitted beam current is possible in the ON condition (FIG. 3), and is undertake by comparing the required value (by means of the user interface) with the value measured by the sensor S. Such comparison is undertaken by the electronic system C, which provides for the consequent regulation of the heating power applied to the cathode by means of a command to the feeder R, and then finally bringing said cathode to the temperature which assures the required emission.

The system described is advantageous in as much as:
  it uses one electrode E of said electrodes E, EO etc. and a respective accelerating voltage generator GE, which are necessary for continuous operation;
  to achieve the ON-OFF modulation it is necessary to interrupt only the anode leakage current (which may be minimized when designing the gun by increasing the efficiency thereof, and which is understood as being the ratio between the beam current downstream of the accelerating electrodes and the cathode emission) and not the entire cathode emission current, thus reducing the problems associated with the construction thereof;
  it is independent of the output of the gun employed and of the technology with which the gun is made, as a result of which it is possible for high currents to be interrupted;
  it is independent of the procedures of application of the accelerating voltage (anodes positive and cathode grounded, or anodes grounded and cathode negative), as the switch has equivalent branches for isolation and resistance to the high tension, and is connected in parallel with the gun.

Figure 4:
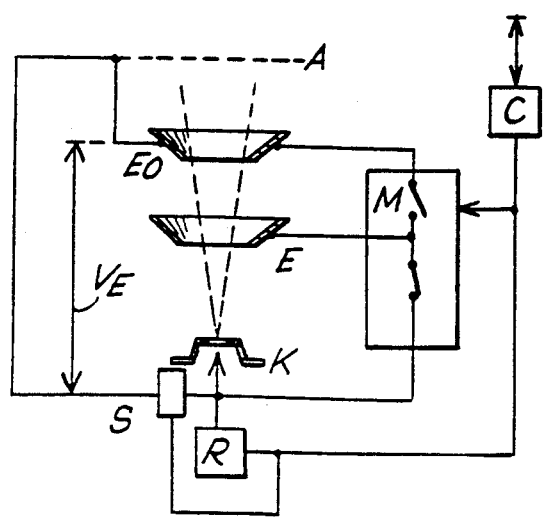

In particular, the object of the invention is also to obtain an ON-OFF modulated beam, using a switch of the solid state type obtained by connecting two solid state high tension interrupters as in FIGS. 3 and 4, each one of which can be realized as in Italian pat. appl. No. 9533 A/90, filed Nov. 28, 1990 laid open for public inspection Oct. 10, 1991.

The accelerating voltage which the switch is able to manage is dependent upon the stages employed on each interrupter, and can therefore be adapted to the particular requirement. The switch forming the subject of the invention permits the modulation of beams of power in the order of tens of kW by DC up to frequencies exceeding kHz.

Figure 1:
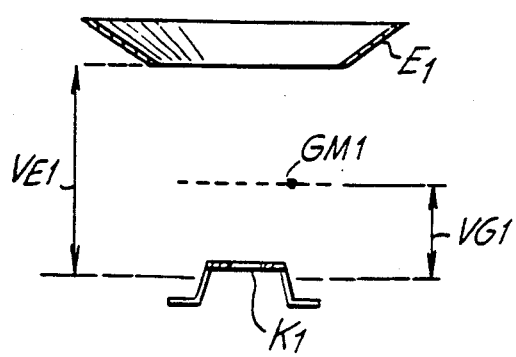
FIGS. 1 and 2 show known solutions, which have already been illustrated hereinabove.

In summary, FIG. 1 shows a known electron gun having a cathode K1, and an accelerator electrode E1 fed with accelerating voltage VE1 and equipped with an appropriate modulating electrode GM1 included between K1 and E1. The modulating electrode GM1 has a relative bias with respect to the cathode K, in the form of voltage VG1. The anode is indicated by A.

Figure 2:
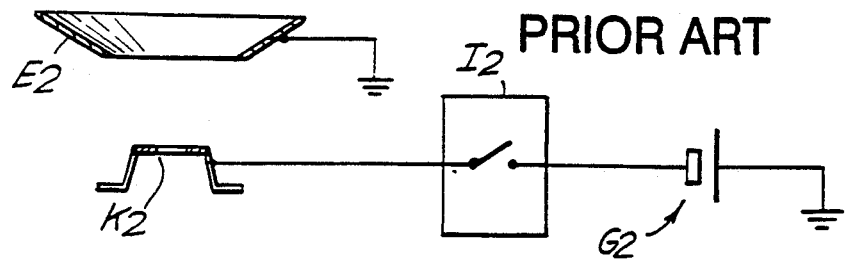

FIG. 2 shows a known electron gun K2, E2. The modulation is obtained by interrupting the cathode emission current originating from the generator G2, with an interrupter I2.

FIGS. 3 and 4 show an exemplification of the gun-switch device forming the subject of the present invention. The exemplification set forth concerns a gun with two accelerating electrodes EO and E, of which one (EO) is fed by the voltage VE, and the other (electrode E is conditioned by the modulator M in such a manner as to obtain the ON-OFF modulation of the beam, with the switching of the two interrupters of said modulator M, as shown in FIGS. 3 and 4.

The switch M is connected to the pertinent electronic control system and interface C. The switch M itself provides galvanic separation resistant to high voltages between the operational parts in association with the gun and the electronic system C. The value of the modulated current may be selected by means of a digital command to be passed to the electronic control system and interface C. This value is utilized by the electronic system C as set points for a closed-loop control of the beam current from the cathode.

While specific embodiments of the invention have been shown and described in detail to illustrate the application of the principles of the invention, it will be understood that the invention may be embodied otherwise without departing from such principles.

I claim:

1. An electron gun comprising:
    a cathode;
    a first electrode spaced from said cathode;
    a second electrode positioned between said cathode and said first electrode;
    switching means for generating an electron beam by connecting said first electrode to said second electrode and keeping said second electrode at a potential of said first electrode in a first position, said switching means having a second position for interrupting said electron beam by connecting said second electrode to said cathode and keeping said second electrode at a potential of said cathode, said switching means switching said electron beam between an on state and an off state by switching said second electrode between said potential of said first electrode and said cathode.

2. An electron gun in accordance with claim 1, further comprising:
    a voltage generator means for generating said potential of said cathode and said potential of said first electrode, said potential of said cathode being negative compared to said first electrode.

3. An electron gun in accordance with claim 2, wherein:
    said voltage generator means is a portion of a space vehicle.

4. An electron gun in accordance with claim 3, wherein:
    said portion of said space vehicle is a tethered portion of said space vehicle.

5. An electron gun in accordance with claim 1, wherein:
    said switching means is a high voltage solid state double interrupter.

6. An electron gun in accordance with claim 1, further comprising:
    current sensor means for sensing actual beam current supplied to the cathode;
    control means for comparing said actual beam current with a desired beam current and for regulating a temperature of said cathode to substantially equalize said actual beam current with said desired beam current.

7. An electron gun in accordance with claim 6, wherein:
    said current sensor means senses current flowing into said cathode; and
    said control means raising and lowering said temperature of said cathode to raise and lower said actual beam current respectively, said actual beam current being varied for said substantial equalization of actual and desired beam current.

* * * * *